(12) United States Patent
Choi et al.

(10) Patent No.: US 8,385,079 B2
(45) Date of Patent: Feb. 26, 2013

(54) PRESSURE CONDUCTIVE SHEET

(75) Inventors: Jae-Hoon Choi, Cheonan-si (KR);
Jae-Seon Hwang, Asan-si (KR);
Hyo-Jae Bang, Cheonan-si (KR);
Hai-Young Lee, Seongnan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 384 days.

(21) Appl. No.: 12/624,552

(22) Filed: Nov. 24, 2009

(65) Prior Publication Data
US 2010/0149776 A1 Jun. 17, 2010

(30) Foreign Application Priority Data
Nov. 28, 2008 (KR) .................. 10-2008-0119506

(51) Int. Cl.
*H05K 7/00* (2006.01)
(52) U.S. Cl. .................. 361/783; 174/262; 174/263
(58) Field of Classification Search .................. 361/783; 174/262, 263, 264, 265, 266
See application file for complete search history.

(56) References Cited

U.S. PATENT DOCUMENTS

| | | | |
|---|---|---|---|
| 4,604,303 | A | 8/1986 | Takakura et al. |
| 5,175,214 | A | 12/1992 | Takaya et al. |
| 2006/0102997 | A1 | 5/2006 | Bang et al. |
| 2006/0121757 | A1 * | 6/2006 | Chung et al. .................. 439/91 |
| 2006/0226928 | A1 * | 10/2006 | Henning et al. ................ 333/33 |

FOREIGN PATENT DOCUMENTS

| | | |
|---|---|---|
| JP | 08-316010 | 11/1996 |
| KR | 1987-0001252 | 6/1987 |

OTHER PUBLICATIONS

Signal Integrity and Reliability of a New Multi-Stack Package using a Pressure Conductive Rubber; Kibum Kang, Jindo Byun, Jae-Won Jang, Hai-Young Lee; "Department of Electronics Engineering, Ajou University, San 5, Woncheon-Dong, Yeongtong-Gu, Suwon 443-749, Korea" Jae-Hoon Choi, Jae-Seon Hwang, Dong-Chun Lee *Samsung Electronics Co., Ltd. #723 Bukdu-Ri, Baebang-Myeon, Asan-City, Chungcheongnam-Do 336-711, Korea* 978-1-4244-2634-8/08 IEEE *pp. 214-217*.

* cited by examiner

*Primary Examiner* — Yuriy Semenenko
*Assistant Examiner* — Andargie M Aychillhum
(74) *Attorney, Agent, or Firm* — Stanzione & Kim, LLP

(57) ABSTRACT

A pressure conductive sheet includes a connector body formed of a thin plate of insulation material, an elastic body deposited as one body with the connector body, pluralities of connection terminals provided with a given interval to pass through the elastic body and the connector body, and a ground plate constituting a matching circuit, the ground plate being buried by a given width in between the connector body and the elastic body. The ground plate is coupled to a ground terminal among the connection terminals and is separated from an outer circumference face of a signal terminal. The connector body, the elastic body, the connection terminals and the ground plate are combined with one another to substantially reduce an interference between signal terminals through the matching circuit formed based on capacitance of a gap between a ground face of the ground plate and the signal terminal, and to improve electrical characteristics.

14 Claims, 22 Drawing Sheets

PRESSURE CONDUCTIVE SHEET

CROSS-REFERENCE TO RELATED APPLICATIONS

This application claims priority under 35 U.S.C. §119 from Korean Patent Application 10-2008-0119506, filed on Nov. 28, 2008, the contents of which are hereby incorporated by reference in their entirety as if fully set forth herein.

BACKGROUND

1. Field of the Invention

The inventive concept relates to a pressure conductive sheet, and more particularly, to a pressure conductive sheet for substantially preventing interference between signal terminals and thus improving an electrical characteristic by extending a ground area between connection terminals.

2. Description of the Related Art

Semiconductor products are necessary elements to perform various functions in a wide variety of technological fields.

Even though recent semiconductor products may be capable of performing more functions than older semiconductor products, the size of more recent semiconductor products may still be smaller than previous products so they may be used in microminiaturized and highly-integrated devices and products.

Some semiconductor products are package types that are configured to be mounted on a circuit substrate. Multiple semiconductor products may be mounted two-dimensionally on one circuit substrate.

On the other hand, recent stacking-type, or stacked, semiconductor packages may be mounted on a circuit substrate by stacking one semiconductor package on top of another. This arrangement allows devices to be further miniaturized.

Stacked semiconductor packages generally use a package-on-package (PoP) type of coupling a package to stack one semiconductor device upon another via soldering.

However, using a solder joint requires a high temperature of 240° or more and this may cause the package to bend or may create a short-circuit between soldering faces due to a severe thermal stress.

To prevent these problems caused by soldering, semiconductor chips may be stacked within one package. However, stacking multiple semiconductor chips within one package may cause problems with package yield, manufacturing costs, etc.

Alternatively, a package stack using a pressure conductive rubber (PCR) may be used. Pressure conductive rubber is made up of conductive particles that contact each other when pressure is applied to the rubber. Thus, if pressure is applied to one point of a sheet of PCR by a connection lead, for example, the portion of the PCR compressed by the connection lead becomes conductive and the portions of the PCR that are not being compressed by the connection lead would not be conductive. Instead, they may serve as insulation.

A plurality of semiconductor packages may be stacked by using PCR so that the connection bumps of the semiconductor packages compress the PCR, generating electrical connections with other semiconductor devices or with a connector body, for example. A connector body may be made of solidified insulation powder.

However, although stacking semiconductor devices with PCR should yield similar results to stacking semiconductor devices using solder, when the two methods are compared, the PCR structure provides a lowered-signal integrity at a specific frequency.

Therefore, a matching circuit must be used at an inductive interconnection section in the stacked circuit to improve a signal integrity when using a PCR structure, or a similar structure that requires that pressure be applied to the semiconductor device connections.

SUMMARY

Some embodiments of the inventive concept provide a pressure conductive sheet capable of improving a signal integrity characteristic by extending a capacitance between a ground block and a signal block of a connection terminal and thus obtaining an impedance matching at a junction section. Interference between adjacent signals may be substantially reduced, thereby obtaining a stabilized signal transmission.

Additional aspects and utilities of the present general inventive concept will be set forth in part in the description which follows and, in part, will be obvious from the description, or may be learned by practice of the general inventive concept.

According to an embodiment of the inventive concept, a pressure conductive sheet may include a connector body formed of a thin plate of insulation material; pluralities of connection terminals provided with a given interval, passing through the connector body to obtain an electrical signal transfer; and a ground plate constituting a matching circuit, the ground plate being buried by a given width in the connector body and being coupled to a ground terminal among the connection terminals and being separated by a given width from an outer circumference face of a signal terminal.

In a pressure conductive sheet according to an embodiment of the inventive concept to obtain an electrical signal transfer between packages in a package module of a stack type, a ground plate may be provided with a given width. The ground plate may be in contact with a ground terminal of the connection terminal, thereby substantially extending the ground area, and further the ground plate may be separated from an outer circumference face of the signal terminal, thereby increasing capacitance between the signal terminal and the ground face and thus substantially reducing impedance of a junction portion.

In addition, a matching circuit may be provided by using capacitance of a gap between a signal terminal and a ground face, thereby substantially decreasing interference between signal terminals and thus improving an electrical characteristic.

Any of the connector body, the ground plate, and the connection terminals may include a solidified powder. The connector body may include a solidified insulation powder, and the ground plate and connection terminals may include a solidified electrical conduction powder.

A pressure conductive sheet may include: a ground plate; first and second insulation bodies on either side of the ground plate; and connection terminals having conductive material in vias through the first and second insulation bodies and the ground plate, the connection terminals having ground terminals electrically connected to the ground plate and signal terminals that are electrically separated from the ground plate.

The ground plate may include holes at locations corresponding to the signal terminals, the holes of the ground plate having diameters larger than respective widths of the vias through the first and second insulation bodies, such that the ground plate is separated from the signal terminals by a predetermined gap.

At least one of the first and second insulation bodies may include an elastic body, and the elastic body may include rubber.

At least one of the first and second insulation bodies may include a connection body comprising one of silicon, FR4 of an epoxy group, or rubber.

At least one of the first and second insulation bodies may include a connection body having an elastic body on at least one surface of the connection body.

The connection body may include an inside surface facing the ground plate and an outside surface opposite the inside surface, and the elastic body may be located on the outer surface of the connection body. Alternatively, the elastic body may be located on the inside surface of the connection body, or on both the inside surface and the outside surface of the connection body.

The connection terminals may include a pressure-conductive material that is substantially non-conductive when not compressed and is conductive when compressed.

The ground plate may be located only at portions of the first and second insulation bodies having the connection terminals. Alternatively, the ground plate may be located over an entire area of the first and second insulation bodies.

The ground plate may be located only at a portion of the first and second insulation bodies between and including the connection terminals.

The ground plate may be located only at portions of the first and second insulation bodies having the connection terminals, and the ground plate may surround only a part of a circumference of each connection terminal.

The ground plate may surround substantially 50% of the circumference of each connection terminal.

The ground plate may include a main portion and an extended portion, wherein the main portion of the ground plate may surround only a part of each of the connections terminals, and the extended portion of the ground plate may surround the rest of at least one of the connection terminals.

The ground plate may be configured so that at least one of (1) the size of the ground plate and (2) a distance from the ground plate to at least one of the signal terminals is set to form a matching circuit.

A stacked semiconductor device may include: a ground plate, first and second insulation bodies on either side of the ground plate, connection terminals comprising conductive material in vias through the first and second insulation bodies and the ground plate, the connection terminals comprising ground terminals electrically connected to the ground plate and signal terminals that are electrically separated from the ground plate, and semiconductor packages connected to each end of the connection terminals.

The ground plate may be configured so that at least one of the size of the ground plate and a distance from the ground plate to at least one of the signal terminals is set to form a matching circuit to match an impedance of the pressure conductive sheet to an impedance of at least one of the semiconductor packages connected to the connection terminals.

A method of forming a pressure conductive sheet may include: forming at least one hole in a ground plate, forming at least one insulation layer, burying the ground plate within at least one insulation layer, forming at least two vias in the insulation layers and the ground plate, at least a first via of the two vias corresponding to the at least one hole in the ground plate, the hole in the ground plate having a circumference larger than a circumference of the first via, and forming connection terminals of a conductive material across the vias.

The conductive material may be a pressure conductive material, and the method may further include: exerting pressure upon at least the pressure conductive material from at least one end of each of the vias to form an electrical connection between the pressure conductive material of at least a second one of the at least two vias and the ground plate, wherein no electrical connection is formed between the pressure conductive material of the first via and the ground plate.

The pressure may be exerted upon the pressure conductive material by pressing at least one semiconductor package against at least one end of each of the vias.

The pressure may be exerted upon the pressure conductive material of at least one of the vias by simultaneously pressing a first semiconductor package against one end of the at least one via and a second semiconductor package against the other end of the at least one via.

Forming at least one insulation layer may include solidifying a powdered insulator.

Forming at least one insulator may include forming a layer of an elastic material to absorb a mechanical shock.

Forming at least one insulator may include forming a first non-elastic connection layer, and forming a second, elastic layer on the non-elastic connection layer. The second, elastic layer may be formed on each side of the non-elastic connection layer.

The size of the ground plate and the hole in the ground plate may be formed of such a size so as to match a predetermined impedance.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
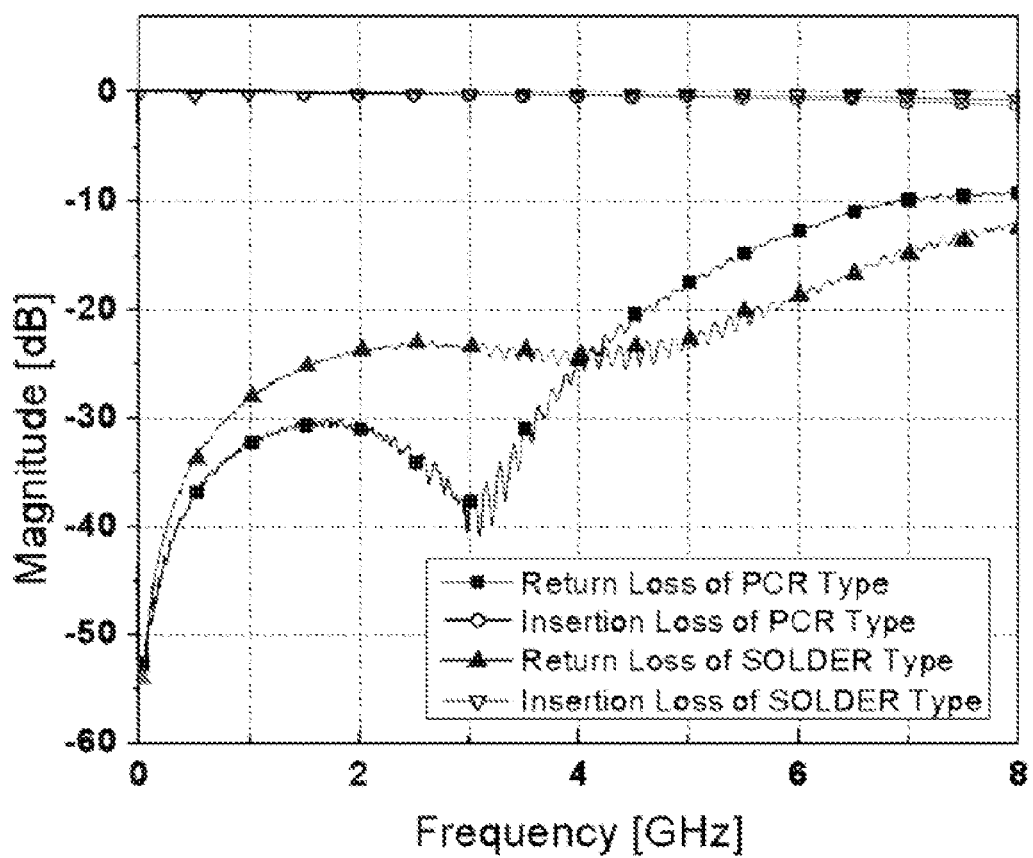
FIG. 1 is a graph for an electrical characteristic comparison of general PCR junction and solder junction.

Embodiments of the inventive concept now will be described more fully hereinafter with reference to the accompanying drawings, in which embodiments of the inventive concept are shown. The inventive concept may, however, be embodied in many different forms and should not be construed as limited to the embodiments set forth herein. Rather these embodiments are provided so that this disclosure will be thorough and complete, and will fully convey the inventive scope to those skilled in the art.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

A pressure conductive sheet according to an embodiment of the present inventive concept may be an interface to transfer an electrical signal between packages of a stacked semiconductor device.

The pressure conductive sheet may be inserted between stacked semiconductor packages, so that when mechanical pressure is applied to the semiconductor packages, both a mechanical and an electrical junction is formed between the semiconductor packages and the pressure conductive sheet.

This pressure conductive sheet may be formed of an insulation sheet having pressure-conductive connection terminals formed at positions on the sheet corresponding to an array of connection pads or bumps of respective semiconductor packages. For example, the insulation sheet may have holes formed at predetermined locations in the sheet, and connection terminals are formed of a pressure-conductive material across the holes. When no mechanical pressure is applied to the material, the material may not transmit electricity. However, when pressure is applied to the material, for example when a semiconductor package is connected to the material, then the material could form a mechanical and electrical connection with the semiconductor package.

As a result, a plurality of semiconductor packages may be joined to connection terminals formed of pressure-conductive material by a mechanical contact of given pressure to simultaneously form an electrical connection.

FIG. 1 is a graph for an electrical characteristic comparison of a general pressure conductive rubber (PCR) junction and a solder junction. As sown in FIG. 1, the PCR junction has an insertion loss that is greater than that of the solder junction by 0.65 dB at frequency of 8 GHz.

This is caused by electrical interference among the electrical signals of the PCR device when the number of terminals increases and a gap between the terminals is reduced. To overcome the problem, a ground area may be increased in the device to increase a capacitance of a signal terminal.

Embodiments of the inventive concept are described in more detail referring to the accompanying drawings, as follows.

Figure 2:
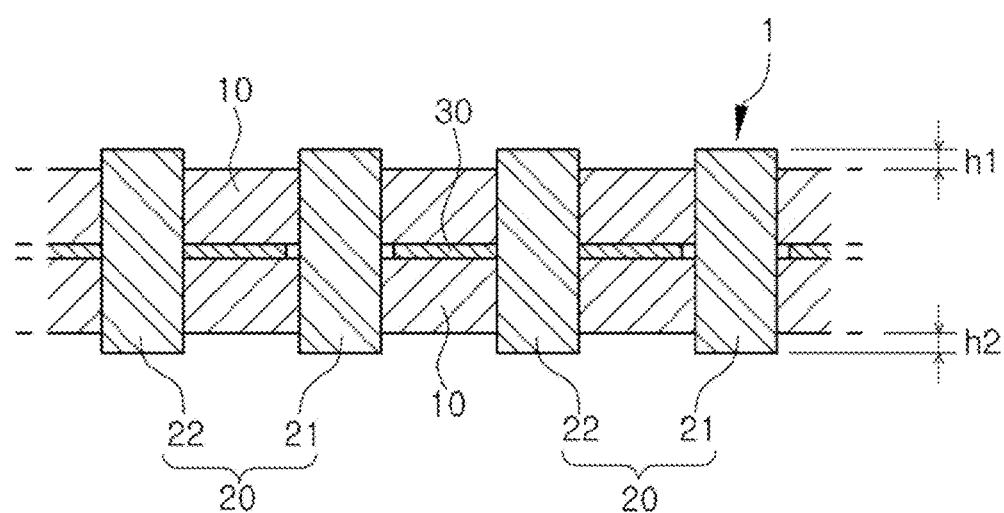
FIG. 2 is a longitudinal sectional view of a pressure conductive sheet according to an embodiment of the inventive concept.
Figure 3:
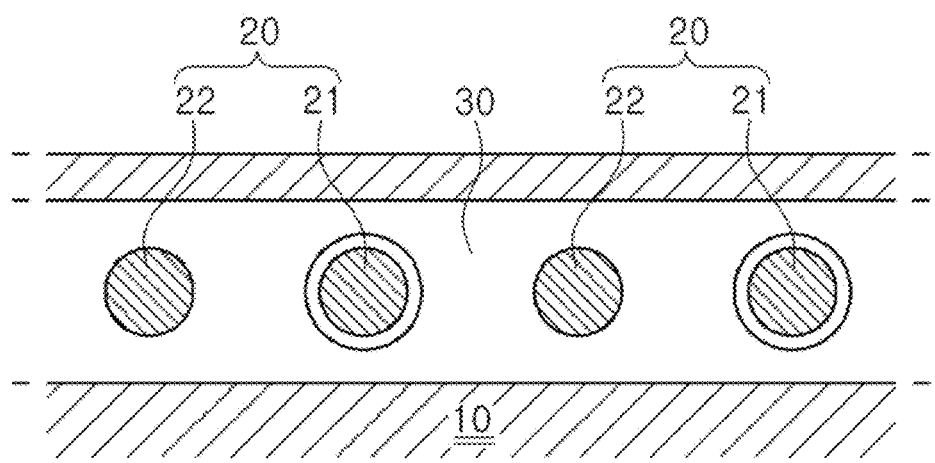
FIG. 3 is a plan and sectional view of FIG. 2.

FIG. 2 is a longitudinal sectional view of a pressure conductive sheet 1 according to an embodiment of the inventive concept. FIG. 3 is a plan and sectional view of FIG. 2.

A reference number 10 indicates a connector body and 20 indicates a connection terminal.

The connector body 10 of a pressure conductive sheet 1 according to an embodiment of the inventive concept is an insulation sheet of a thin plate of insulation material.

The connector body 10 may include an insulator such as silicon, FR4 of an epoxy group, rubber, or any other appropriate insulation material.

The connector body 10 may be formed by solidifying a powdered insulation material and then forming it into a sheet having a plate shape.

The connector body 10 may be formed of any size to provide a predetermined level of insulation.

The connection terminal 20 is adapted to transfer an electrical signal through the connector body 10.

The connection terminal 20 may be formed of conductive material across a hole in the connector body 10. For example, the hole may be formed to pass vertically through the connector body 10.

The connection terminal 20 may be formed of the conductive material across the hole so as to protrude from an upper end and a lower end of the hole by a distance h1 and h2, respectively.

When a pressure is applied to the connection terminal 20 from each end of the connection terminal 20, the particles of the conductive material are compressed, reducing the volume of the connection terminal 20 and joining the connection terminal 20 with a connection pad or a bump of a semiconductor package (not shown). For example, when a semiconductor package is connected to connection terminals 20 and pressure is applied to the connection terminals 20, the distance h1 or h2 between a top of a protruding portion and the body of the pressure conductive sheet 1 may decrease. However, it is also possible that at least one of the distances h1 or h2 may remain unchanged.

The conductive material forming the connection terminal 20 may be Au, a material formed by coating Ni with Au, or any other appropriate conductive material.

A plurality of connection terminals 20 of the connector body 10 may correspond to an array of connection pads or bumps of electronic parts, such as stack-type semiconductor packages.

A ground plate 30 may be buried within the connector body 10 among the connection terminals 20.

The ground plate 30 may include a material having good conductivity. For example, the ground plate 30 may include Au, a gold-plated metal material, Cu, or any other appropriate conductive material.

The ground plate 30 may be formed to contact an outer circumference surface of some connection terminals 22 among the connection terminals 20. The ground plate 30 may further be formed to have a gap between the ground plate 30 and an outer circumference surface of other connection terminals 21.

A connection terminal 20 that has a gap between its outer circumference surface and the ground plate 30 is a signal terminal 21, and a connection terminal 20 that contacts the ground plate 30 is a ground terminal 22.

The ground plate 30 may be formed to span an entire cross-section inside the connector body 10, or it may be formed with a given width on a portion of the connector body 10 on which the connection terminals 20 are located.

Figure 4A:
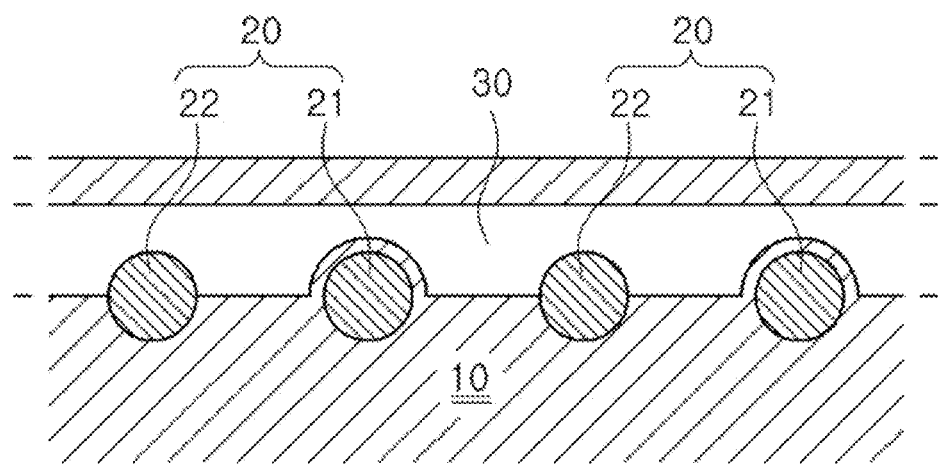
FIGS. 4A-4C are enlarged sectional views of a main part in a ground plate according to embodiments of the inventive concept.
Figure 4B:
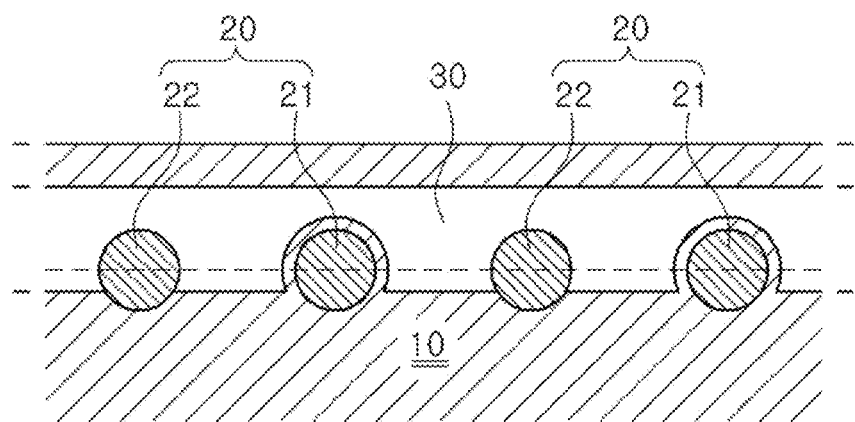

FIG. 4A is an enlarged sectional view of a main part in a ground plate according to an embodiment of the inventive concept. As illustrated in FIG. 4A, the ground plate 30 may be formed to contact or surround just a portion of outer circumference face of each connection terminal 20. In FIG. 4A, the ground plate 30 surrounds about one half of a connection terminal 20, but the ground plate 30 may be designed to surround any portion of the terminal 20. FIG. 4B illustrates a ground plate 30 that surrounds over half of each connection terminal 20, but less than 100% of the connection terminal 20. For example, the ground plate 30 may surround 75% of the circumference of a connection terminal 20.

Figure 4C:
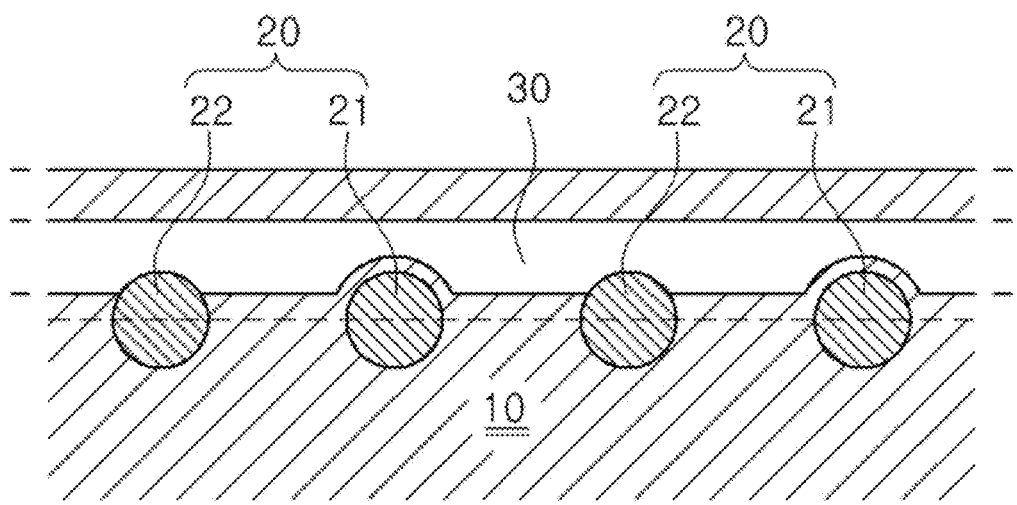

FIG. 4C illustrates a ground plate 30 that surrounds less than half of a connection terminal 20. For example, the ground plate 30 may surround 25% of the connection terminal. The percentage of the connection terminal 20 to be surrounded may depend on a desired connection strength, space available in the electrical circuit, desired capacitance or impedance, or any other consideration. For example, when the ground plate 30 is located only on an outside portion of the pressure conductive sheet, and connects only a portion of the connection terminals 20, other electrical wiring may be formed within the pressure conductive sheet between the terminals. Alternatively, if the ground terminal 30 is formed only on an inside portion of the pressure conductive sheet between the connection terminals 20, other electrical wiring may be formed on an outside edge of the pressure conductive sheet.

Figure 5:
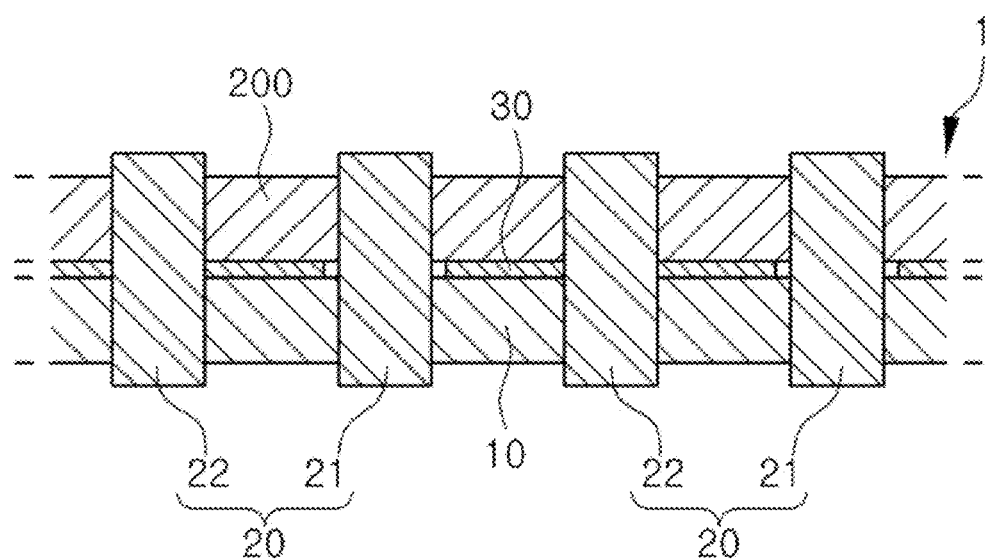
FIG. 5 is a longitudinal sectional view of a pressure conductive sheet according to another embodiment of the inventive concept.
Figure 6:
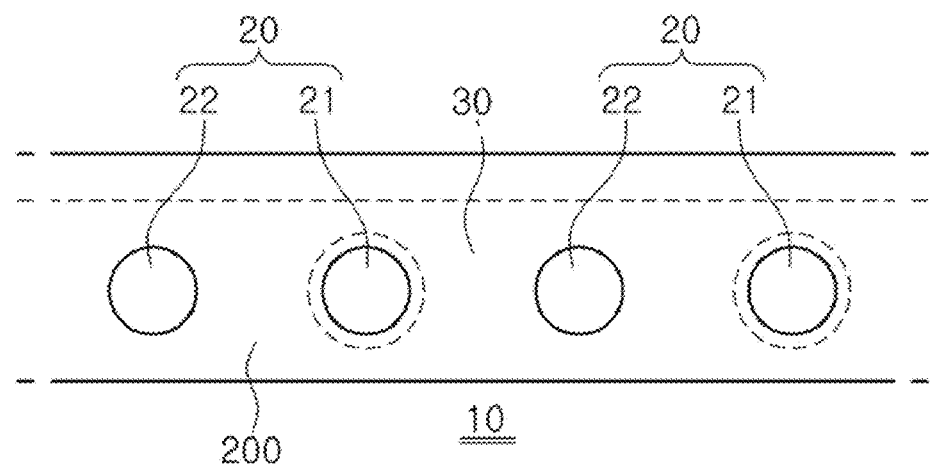
FIG. 6 is a plan and sectional view of FIG. 5.

FIG. 5 is a longitudinal sectional view of a pressure conductive sheet 1 according to another embodiment of the present inventive concept. FIG. 6 is a plan and sectional view of FIG. 5, and FIG. 7 is a perspective sectional view of the configuration according to an embodiment of the inventive concept.

Figure 7:
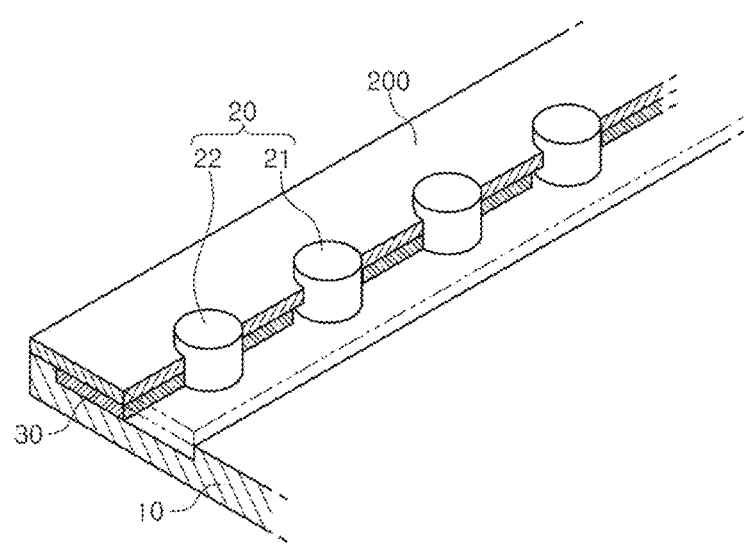
FIG. 7 is a perspective sectional view of the configuration according to the an embodiment of the inventive concept.

As shown in the drawings, an embodiment of the inventive concept of FIGS. 5-7 may include a connector body 10, an elastic body 200, a connection terminal 20, and a ground plate 30.

The elastic body 200 may be provided to relieve a shock that may be caused when mechanical pressure is applied to the pressure conductive sheet 1, for example, when a semiconductor package (not shown) is pressed against the pressure conductive sheet 1.

The elastic body 200 may be deposited on an upper face or lower face of the connector body 10, or an elastic body 200 may be simultaneously deposited on the upper and lower faces of the connector body 10 to absorb the mechanical pressure shock. Alternatively, a connector body 10 may be used that is also an elastic body 200. For example, if rubber is used as a connector body 10, it may also be an elastic body 200 by providing shock.

The elastic body 200 may be formed of insulation material such as rubber or any other material capable of absorbing a mechanical shock.

Connection terminals 20 transfer electrical signals to an upper part and a lower part of a combined body of the conductive sheet 1 formed by combining the connector body 10 and the elastic body 200.

The connection terminal 20 may be formed of conductive material across a hole. The hole may pass vertically through the combined body of the connector body 10 and the elastic body 200.

The connection terminal 20 may be formed of the conductive material across the hole so as to protrude from the upper end part and the lower end part of the hole. The conductive material of the connection terminal 20 that protrudes from each end of the hole in pressure conductive sheet 1 including the connector body 10 and the elastic body 200 may connect with a connection pad or package bump of a semiconductor package via mechanical contact.

The ground plate 30 may be a thin plate buried in between the connector body 10 and the elastic body 200. Alternatively, the ground plate 30 may be buried between two connector bodies 10, and one or both of the connector bodies 10 may have an elastic body 200 formed on an inner or outer surface. In another arrangement, the ground plate 30 may be buried between two elastic bodies 200.

The ground plate 30 may be formed of material having good conductivity, such as Cu or any other appropriate conductive material. The width of the ground plate 30 may be configured to connect a plurality of connection terminals 20 between the connector body 10 and the elastic body 200.

In the pressure conductive sheet according to an embodiment of the inventive concept, a ground area of each connection terminal 20 is greatly extended and also a distance between each signal terminal 21 and a ground face of the ground plate 30 is reduced, thereby increasing a capacitance between the signal terminal 21 and the ground plate 30.

Impedance of a transmission line is shown in the following numerical expression, $$Z_0 = \sqrt{\frac{L}{C}}$$

C being capacitance and L being inductance. Here, C indicates capacitance between the signal terminal 21 and the ground face of the ground plate 30, and L indicates an inductance of the signal terminal 21.

According to embodiments of the inventive concept, a ground face area on the periphery of the signal terminal 21 is may be extended, thereby increasing the capacitance between the signal terminal 21 and the ground face to provide a matching circuit.

Generally speaking, a matching circuit is formed by matching an impedance of an input load to an impedance of an output load to maximize signal transfer. As discussed above, the size of the ground plate and the distances between the ground plate 30 and the signal terminal 21 may be adjusted to adjust the measured capacitance of a transmission line, such as the signal terminal 21, so that an impedance of the pressure conductive sheet 1 is closer to the impedance of a device connected to the pressure conductive sheet 1, or so that the impedances match.

Figure 8A:
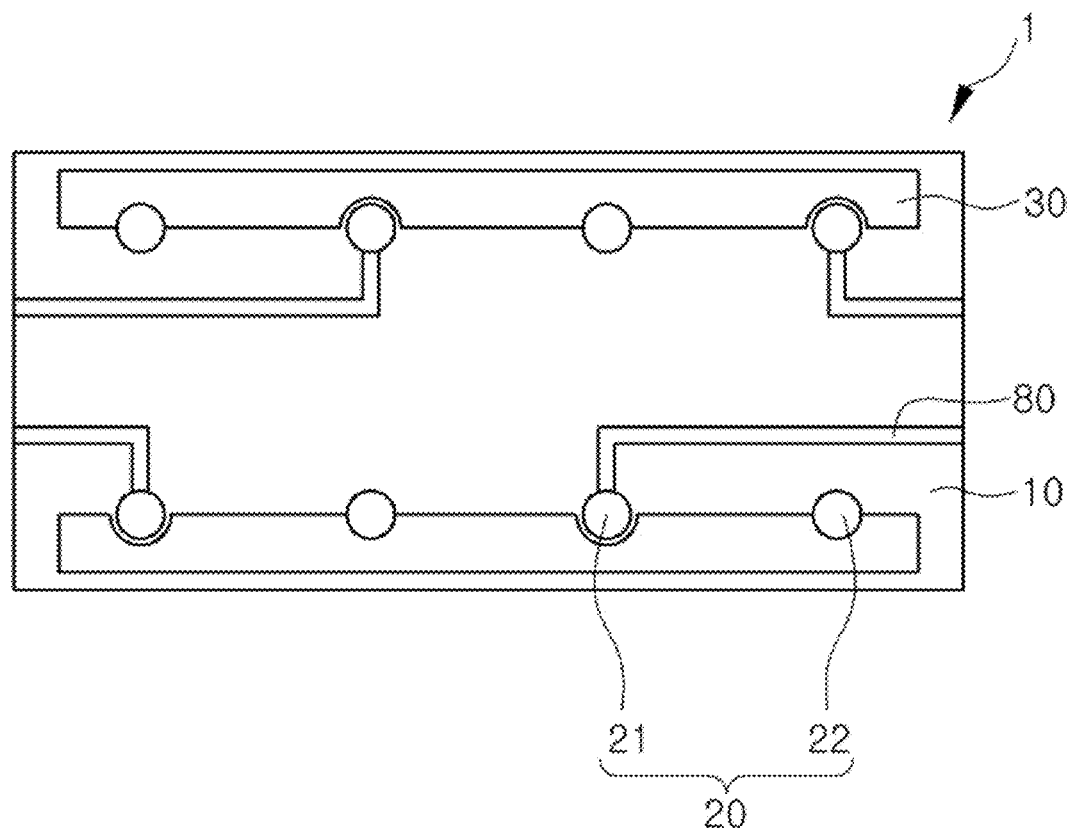
FIGS. 8A-8E are plan views of different configurations of a ground plate.

FIGS. 8A-8E illustrate different configurations of a ground plate 30. In FIG. 8A, the ground plate 30 is located only at the outer edges of the connector body 10 of the pressure conductive sheet 1, so that it surrounds only a portion of the connection terminals 20. Since the center portion of the pressure conductive sheet 1 is not covered by the ground plate 30, it may be used for wiring 80 or other electrical circuitry.

Figure 8B:
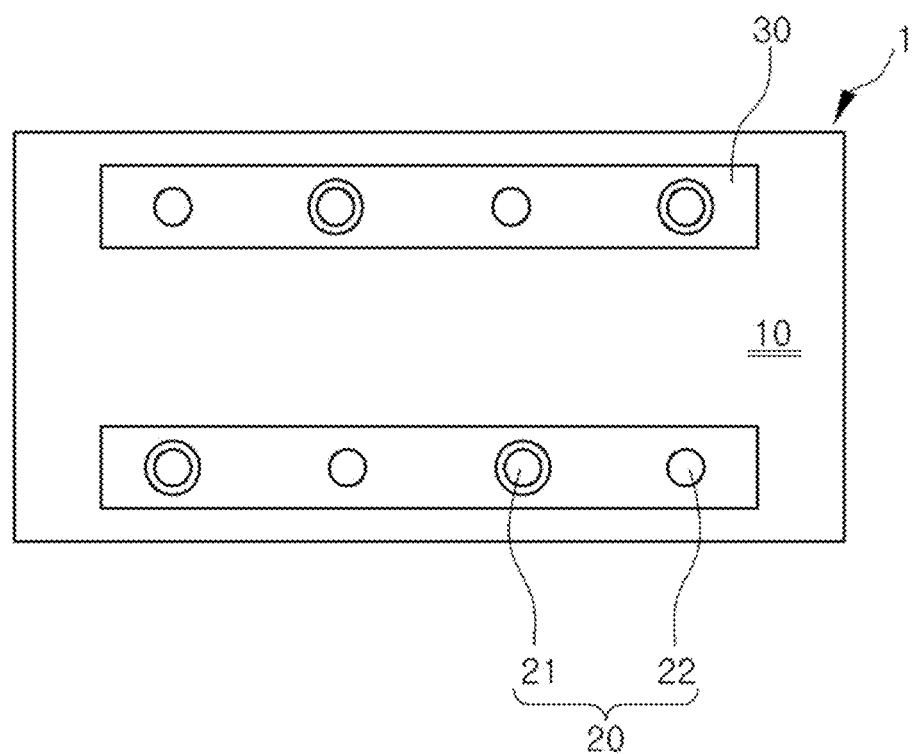
Figure 8C:
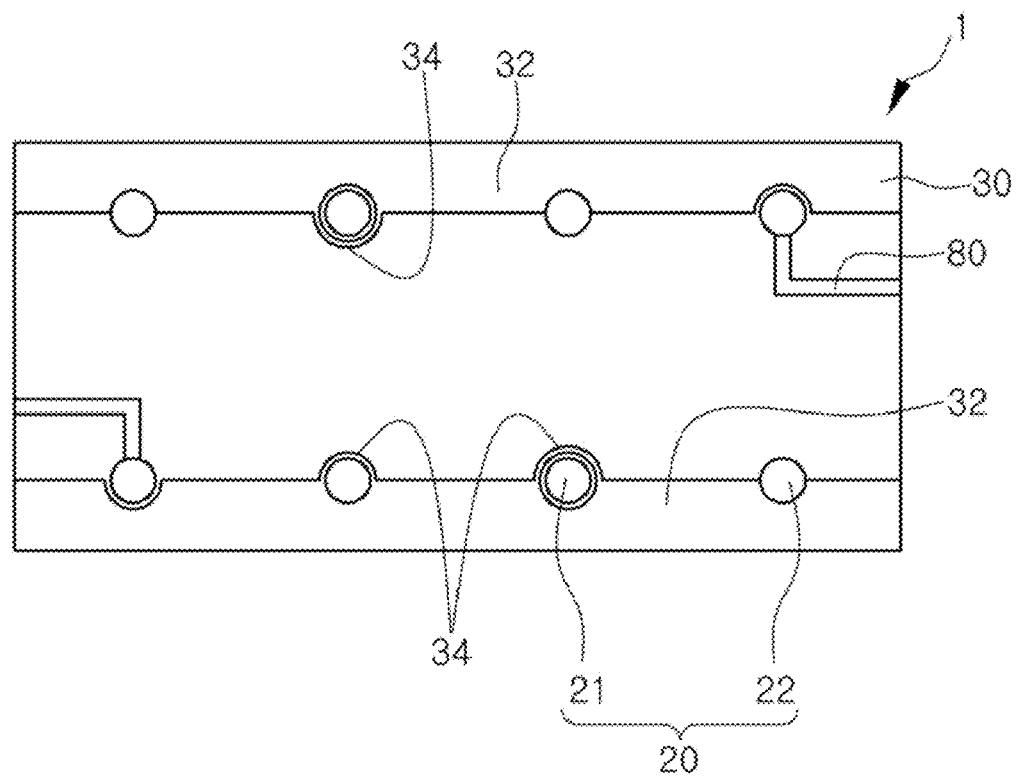

FIG. 8B illustrates ground plates 30 on portions of the connector body 10 having connection terminals 20. The ground plates 30 are wide enough to entirely surround the connection terminals 20. FIG. 8C illustrates ground plates 30 on portions of the connector body 10 having connection terminals 20. The main bodies 32 of the ground plates 30 surround only a portion of the connection terminals 20. However, an extended portion 34 of the ground plate 30 may surround a portion of a connection terminal 20 not surrounded by the main body 32 of the ground plate 30. With this configuration, a ground terminal 22 that is entirely surrounded by the ground plate 30 may achieve a more secure connection with the ground plate. A signal terminal 21 may be completely surrounded by the ground plate 30 including the extended portion 34 to match an impedance or reduce electrical interference, or a signal terminal 21 may be only partially surrounded by the ground plate 30 to allow for additional wiring 80.

Figure 8D:
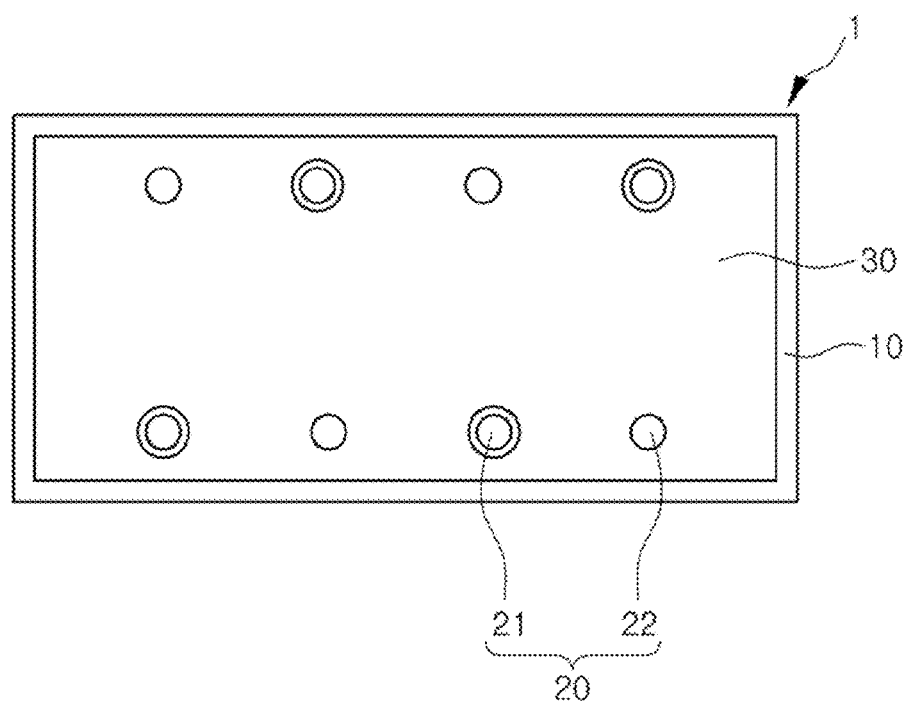
Figure 8E:
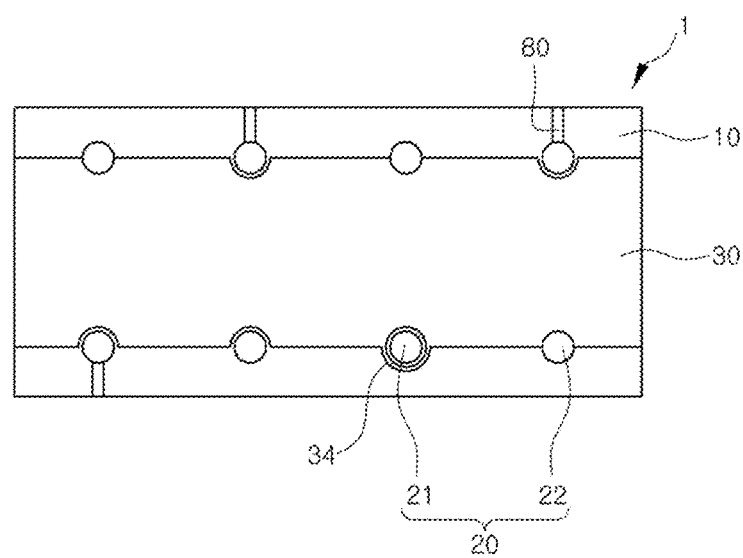

FIG. 8D illustrates a ground plate 30 that covers an entire area, or substantially an entire area of the connector body 10 of the pressure conductive sheet 1. FIG. 8E illustrates a ground plate 30 that covers the area at the center of the connector body 10, but leaves the peripheral portions of the connector body 10 exposed. Wiring 80 or other circuitry may be located on the exposed portions. The ground plate 30 may surround only a portion of the connection terminals 20 or it may entirely surround the connection terminals 20. If the ground plate 30 surrounds only a portion of the connection terminals 20, an extended portion 34 may be formed to entirely surround a connection terminal 20.

Although a few configurations are shown in FIGS. 8A-8E, other configurations may be used as necessary. For example, while two rows of connection terminals are illustrated in FIGS. 8A-8E, more than two rows may be used to connect to semiconductor packages having more than two rows of connection leads or bumps. In addition, the ground plate may have a rectangular configuration, a solid configuration, an open configuration (e.g. ground strips 30 surrounding an exposed center section), an "H" configuration, or any other appropriate configuration.

While embodiments have shown the ground plate 30 either entirely surrounding a connection terminal 20 or partially surrounding a connection terminal 20, a single ground plate 30 may be configured to partially surround some connection terminals 20 and to entirely surround other connection terminals 20.

Figure 9A:
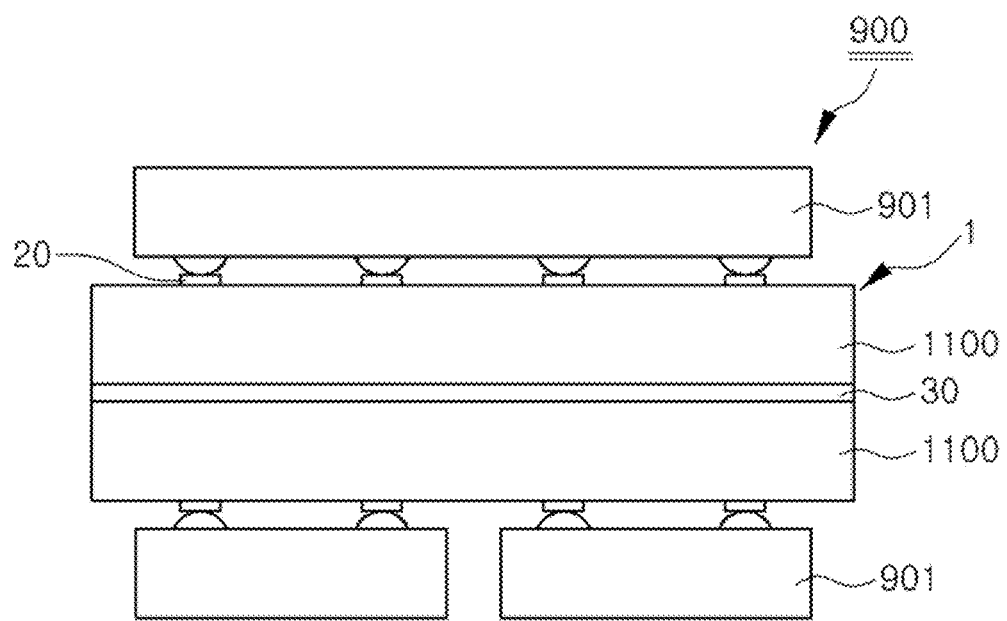
FIG. 9A-9C illustrate different configurations of a stacked semiconductor package.

FIG. 9A illustrates a stacked semiconductor package 900. The pressure conductive sheet 1 may include the ground plate buried between two insulation bodies 1100. The insulation bodies may be connection bodies 10, elastic bodies 200, or both. Connection terminals 20 may be formed of conductive material across holes in the pressure conductive sheet 1. One or more semiconductor elements 901 may be connected to each end of the pressure conductive sheet 1.

Figure 9B:
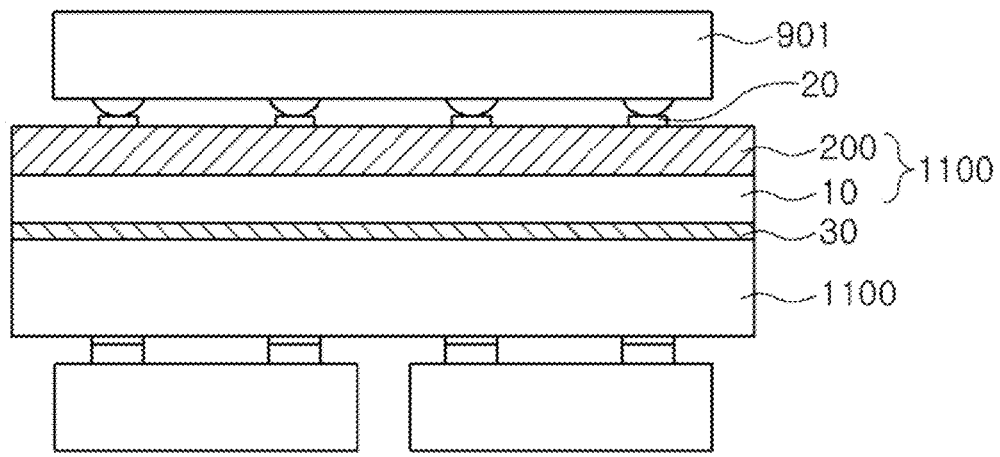
Figure 9C:
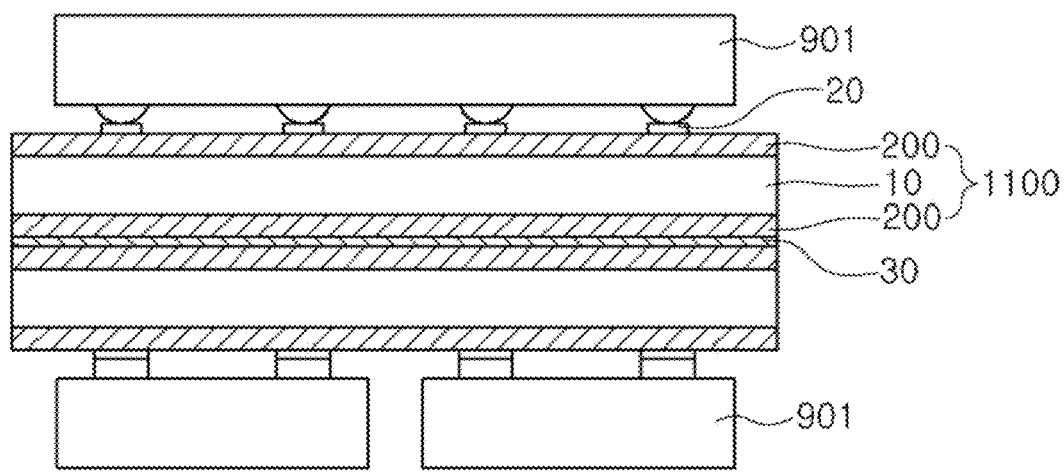

In FIG. 9B, one of the insulation bodies 1100 includes a connector body 10 and an elastic body 200. As discussed above, the elastic body 200 may absorb shock when the semiconductor packages 901 are pressed against the pressure conductive sheet 1. An elastic body 200 may be formed on an outer surface, an inner surface, or both surfaces of a connector body 10. Alternatively, an elastic body 200, such as rubber, may be used as a connector body 10. In FIG. 9C, the insulation bodies include a connector body and two elastic bodies 200, one on each side of the connector body 10.

Figure 10:
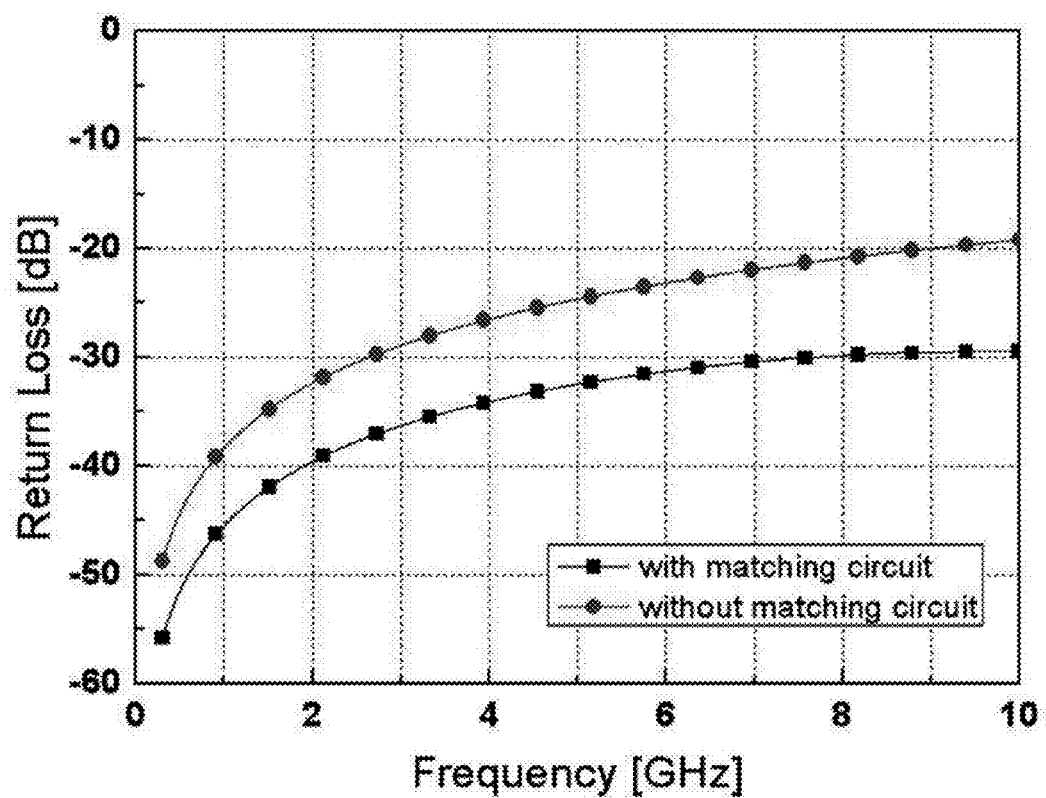
FIGS. 10 and 11 are graphs illustrating an electrical characteristic change based on an application of matching circuit according to an embodiment of the inventive concept.
Figure 11:
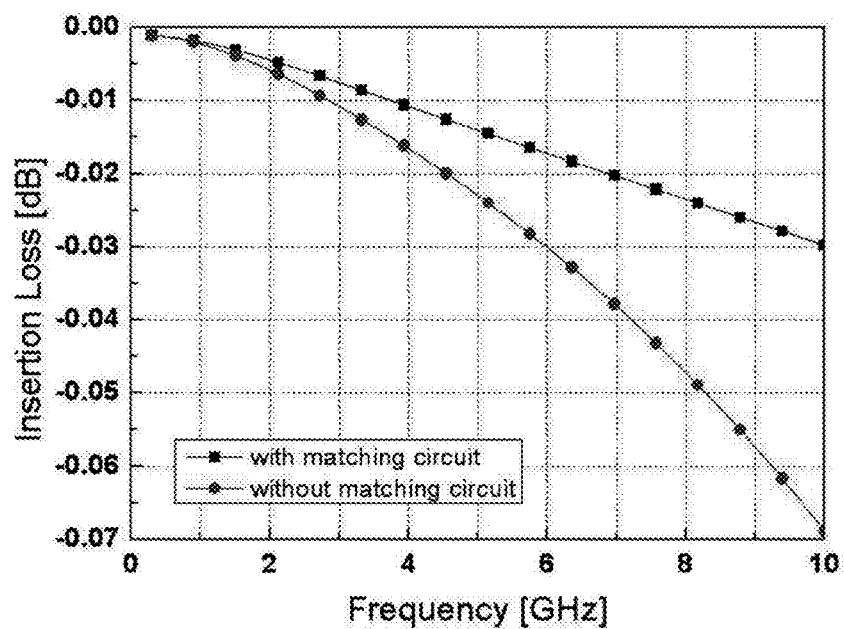

FIGS. 10 and 11 are graphs illustrating an electrical characteristic change based on an application of matching circuit according to an embodiment of the present inventive concept.

In general, at a given frequency, it is better to have a low return loss and a high insertion loss.

As illustrated in the graphs, when the ground plate 30 is used to form a matching circuit, an improvement effect of 10 dB at 10 GHz is obtained in the return loss, and an improvement effect of 0.04 dB is obtained in the insertion loss, compared to an identical circuit in without impedance matching.

Figure 12:
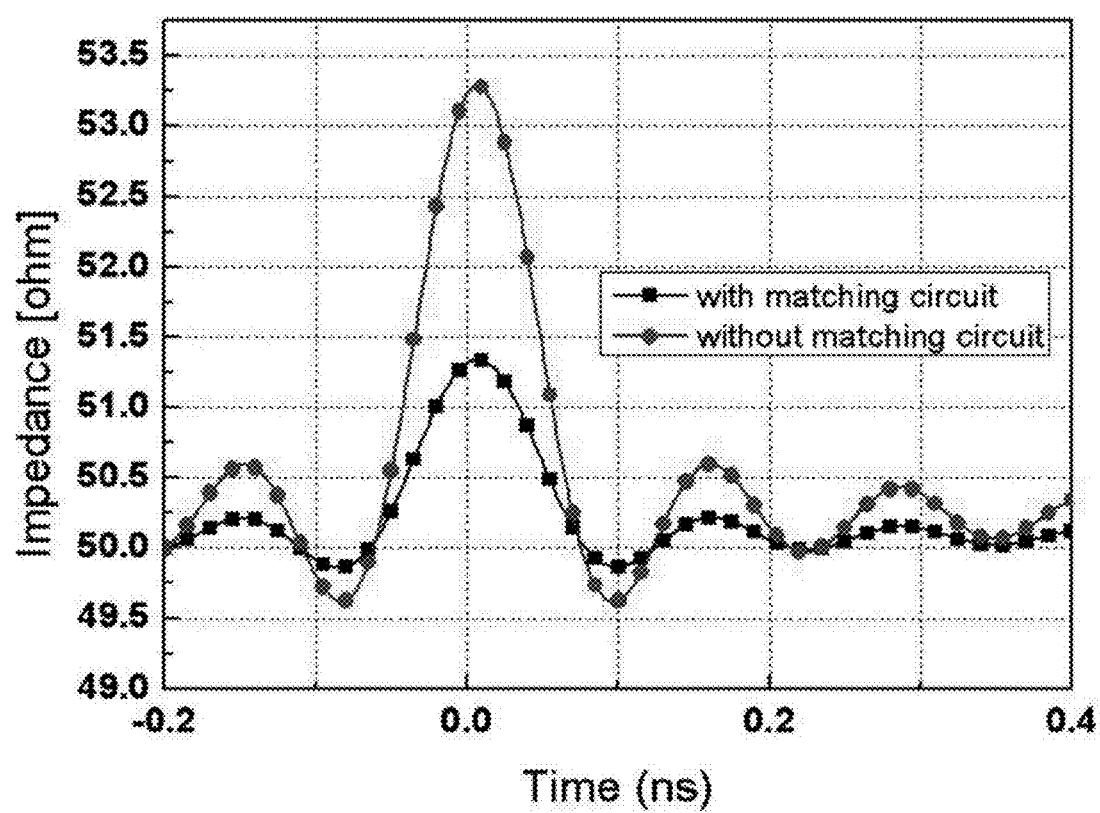
FIG. 12 is a TDR result comparison table of a junction section having a matching circuit according to an embodiment of the inventive concept to a junction section not having a matching circuit.

From an improvement effect analysis of such electrical characteristic through a time domain reflectometry (TDR) result of a junction section, it can be noted that impedance in applying the matching circuit has been improved from 53.3Ω to 51.276Ω as compared with an event of not applying the matching circuit, as shown in FIG. 12.

Accordingly, by locating the ground plate 30 between the signal terminal 21 and the ground terminal 22 a ground area is increased, a matching circuit may be formed, and the signal integrity of the circuit may be increased.

Figure 13:
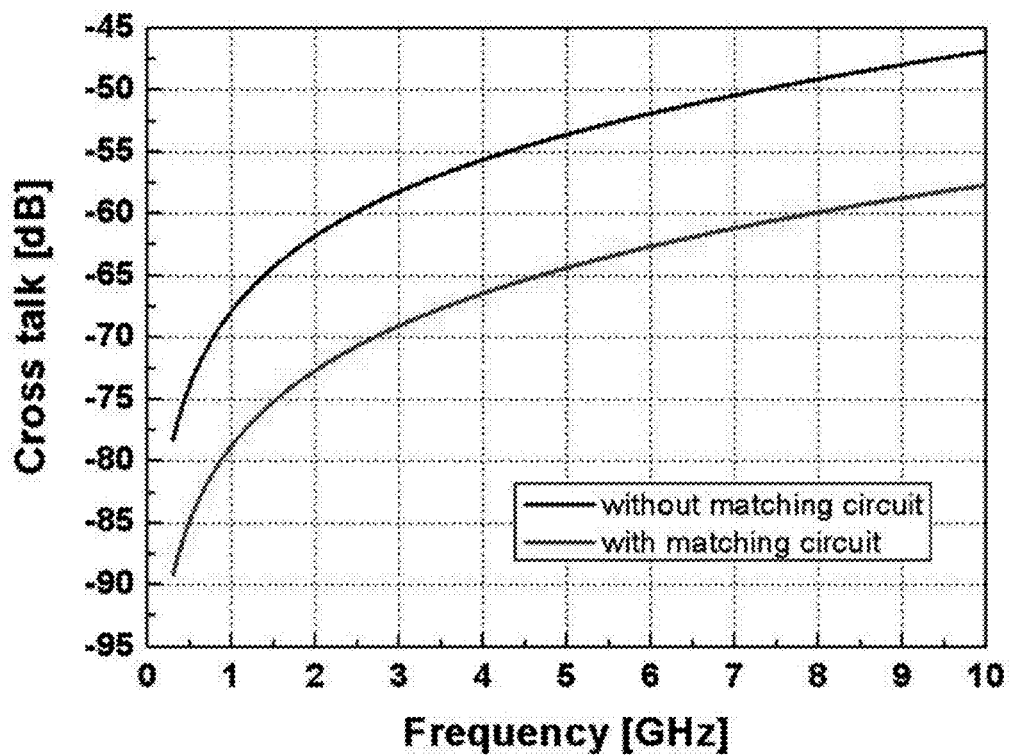
FIG. 13 is a graph comparing a signal interference when a matching circuit according to an embodiment of the present general inventive concept is applied and when no matching circuit is applied.

FIG. 13 is a graph for a signal interference comparison between when a ground plate 30 is configured to form a matching circuit according to an embodiment of the inventive concept and when no such matching circuit is formed.

In the comparison table of FIG. 13 according to an embodiment of the inventive concept, interference between two signal terminals is improved by 11.18 dB by employing the matching circuit between connection terminals 20.

As a result, a ground plate 30 may be coupled between pluralities of connection terminals 20 in the pressure conductive sheet 1 of an embodiment, in particular, the ground plate 30 may closely adhere to the ground terminal 22 thus substantially extending a ground area, and simultaneously the ground plate 30 may be separated by a given distance from the signal terminal 21 to form a matching circuit, to reduce interference between signal terminals, to improve signal integrity, and to obtain more stabilized and improved electrical characteristics.

Figure 14:
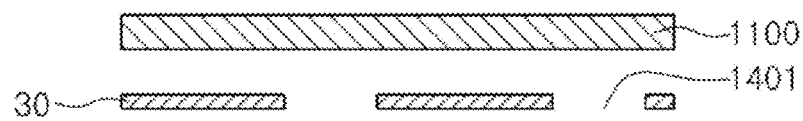
FIG. 14 illustrates a method of manufacturing a stacked semiconductor package.
Figure 14:
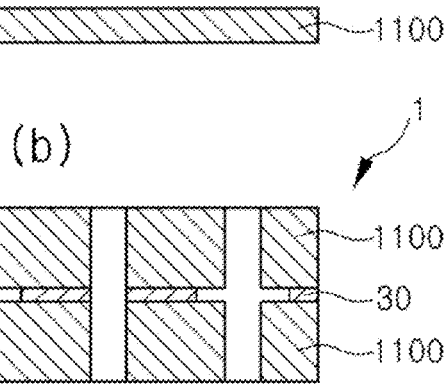
Figure 14:
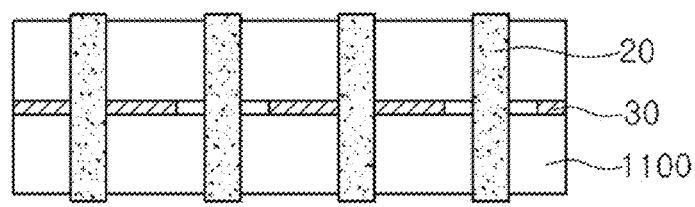
Figure 14:
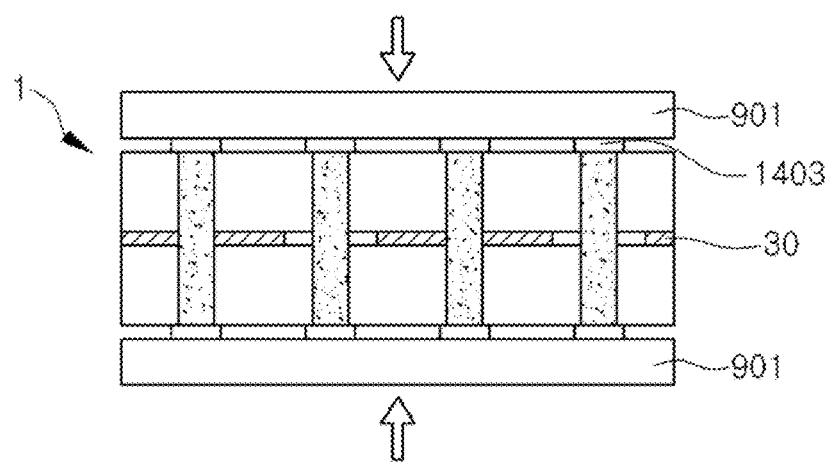

FIG. 14 illustrates a method of forming a stacked semiconductor package according to the present inventive concept. In operation FIG. 14(a), holes 1401 corresponding to the signal terminals 21 are formed in the ground plate 30. Holes corresponding to the ground terminals 22 may also be formed in the ground plate 30 or they may be formed in a later operation. The holes 1401 and the size of the ground plate 30 may be formed to provide predetermined characteristics to the pressure conductive sheet, such as to reduce interference between connection terminals 20 or to match an impedance with an external device.

In operation FIG. 14(b), the ground plate 30 is sandwiched between two insulation layers 1100. The insulation layers 1100 may be connector bodies 10 or elastic bodies 200. Alternatively, one insulation layer 1100 may be a connector body 10 and the other may be an elastic body 200. Alternatively, one or more of the insulation layers may be a connector body 10 having an elastic body 200 formed thereon, as shown, for example, in FIGS. 9B and 9C. Holes are formed in the resulting pressure-conductive sheet 1 to correspond to connection terminals 20. The holes are narrower than the holes formed in the ground plate 30 in operation 14(a) so that a gap exists between a circumference surface of the holes in the insulation layer 1100 and the circumference surface of the holes in the ground plate 30 formed in operation 14(a).

In operation 14(c), connection terminals 20 are formed of a pressure-conductive material across the holes in the pressure-conductive sheet 1 so as to protrude from the top of an upper insulation layer 1100 and the bottom of a lower insulation layer 1100. Gaps may be formed between the connection terminals 20 and the lateral faces of the holes in the ground plate 30 that have a larger circumference than the holes in the insulation layers 1100.

In operation 14(d), external pressure is applied to the pressure-conductive sheet 1 such as by semiconductor packages 901. The connection terminals 20 may be located to correspond to the locations of external leads 1403 of the semiconductor packages 901. Applying pressure to the pressure-conductive material of the connection terminals 20 causes the pressure-conductive material to become conductive, secures a bond between the semiconductor packages 901 and the connection terminals 20, and secures a bond between the pressure conductive material of the ground terminals 22 and the ground plate 30. However, a gap still exists between the ground plate 30 and the signal terminals 21, so that the signal terminals are not connected to ground.

An alternative description of the present inventive concept is a pressure-conductive sheet 1 comprising at least one ground plate 30 between two insulation bodies 1100. The insulation bodies 1100 may be a connection body 10 or an elastic body 200. If the insulation 1100 is a connection body, it may comprise silicon, FR4 of an epoxy group, rubber, or any other appropriate insulation material, for example. It may be formed by solidifying a powdered insulation material and then forming it into a sheet having a plate shape. The connection body 10 may have any area, thickness, or shape sufficient to provide a predetermined level of insulation.

If the insulation body 1100 is an elastic body 200, it may comprise rubber or any other material that may absorb shock.

Alternatively, the insulation body 1100 may comprise both a connection body 10 and an elastic body 200. For example, the insulation body 1100 may have a connection body 10 with an elastic body 200 formed on an outer surface, an inside surface (i.e. facing the ground plate 30), or on both the outer surface and the inside surface. In addition, one or both of the insulation bodies 1100 may include or comprise an elastic body 200. As an example, an insulation body 1100 may comprise powdered silicon that is solidified into a sheet to form a connection body 10. A layer of rubber may be formed on the connection body to form an elastic body 200.

It will be apparent to those skilled in the art that modifications and variations can be made in the present invention without deviating from the spirit or scope of the inventive concept. Thus, it is intended that the inventive concept cover any such modifications and variations of this invention provided they come within the scope of the appended claims and their equivalents.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A pressure conductive sheet comprising:
   a connector body formed of a thin plate of insulation material;
   a ground plate buried within the connector body; and
   connection terminals passing through the connector body and the ground plate to allow electrical signal transfer from one side of the connector body to the other, the connection terminals including signal terminals and ground terminals, the ground terminals being electrically connected to the ground plate,
   wherein the ground plate comprises holes to form a gap between the ground plate and the signal terminals, such that the ground plate does not contact the signal terminals, and
   the ground plate is configured to form a matching circuit,
   the connector body comprises an insulating layer disposed on a first surface of the ground plate and an elastic layer disposed on a second surface of the ground plate, and
   the connection terminals comprise a pressure-conductive material that is substantially non-conductive when not compressed and is conductive when compressed.

2. The sheet of claim 1, wherein the connector body comprises one of silicon, FR4 of an epoxy group, or a rubber plate.

3. The sheet of claim 1, wherein the connector body comprises solidified insulation powder.

4. The sheet of claim 1, wherein the connection terminal comprises solidified conductive powder.

5. The sheet of claim 1, wherein the ground plate comprises solidified conductive powder.

6. A pressure conductive sheet, comprising:
   a ground plate;
   first and second insulation bodies disposed on either side of the ground plate, at least one of the first and second insulation bodies comprising an elastic body; and
   connection terminals comprising conductive material in vias through the first and second insulation bodies and the ground plate, the connection terminals comprising ground terminals electrically connected to the ground plate and signal terminals that are electrically separated from the ground plate,
   wherein the connection terminals comprise a pressure-conductive material that is substantially non-conductive when not compressed and is conductive when compressed.

7. The pressure conductive sheet according to claim 6, wherein the ground plate comprises holes at locations corresponding to the signal terminals, the holes of the ground plate having diameters larger than respective widths of the vias through the first and second insulation bodies, such that the ground plate is separated from the signal terminals by a predetermined gap.

8. The pressure conductive sheet according to claim 6, wherein at least one of the first and second insulation bodies comprises a connection body comprising one of silicon, FR4 of an epoxy group, or rubber.

9. The pressure conductive sheet according to claim 6, wherein the ground plate is located only at portions of the first and second insulation bodies having the connection terminals.

10. The pressure conductive sheet according to claim 6, wherein the ground plate is located over an entire area of the first and second insulation bodies.

11. The pressure conductive sheet according to claim 6, wherein the ground plate is located only at a portion of the first and second insulation bodies between and including the connection terminals.

12. The pressure conductive sheet according to claim 6, wherein the ground plate is located only at portions of the first and second insulation bodies having the connection terminals, and
    the ground plate surrounds only a part of a circumference of each connection terminal.

13. The pressure conductive sheet according to claim 6, wherein the ground plate comprises a main portion and an extended portion,
    wherein the main portion of the ground plate surrounds only a part of each of the connections terminals, and
    the extended portion of the ground plate surrounds the rest of at least one of the connection terminals.

14. The pressure conductive sheet according to claim 6, wherein at least one of (1) a size of the ground plate and (2) a distance from the ground plate to at least one of the signal terminals is configured to form a matching circuit with an external device.

* * * * *